(12) United States Patent
Ng

(10) Patent No.: US 6,208,209 B1
(45) Date of Patent: *Mar. 27, 2001

(54) AUTOMATIC GAIN CONTROL CIRCUIT USING A CAPACITOR FOR MINIMIZING DIGITAL COUPLING

(75) Inventor: Solomon Ng, Singapore (SG)

(73) Assignee: SGS-Thompson Microelectronics Pte. Ltd. (SG)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/807,011

(22) Filed: Feb. 26, 1997

(30) Foreign Application Priority Data

Feb. 29, 1996 (FR) .................................... 9602783

(51) Int. Cl.⁷ ...................................... H03G 3/30
(52) U.S. Cl. .................. 330/279; 330/281; 330/134
(58) Field of Search ..................... 330/129, 141, 330/279, 281, 254, 285, 133, 134

(56) References Cited

U.S. PATENT DOCUMENTS

| | | | |
|---|---|---|---|
| 4,145,665 | * 3/1979 | Wisotzky et al. | 330/281 X |
| 4,318,053 | 3/1982 | Sondermeyer | 330/281 |
| 4,371,842 | * 2/1983 | Lee | 330/281 X |
| 4,451,797 | 5/1984 | Bains, Jr. | 330/134 |
| 5,309,115 | * 5/1994 | Hashimoto et al. | 330/134 X |
| 5,418,494 | 5/1995 | Betti et al. | 330/254 |
| 5,422,602 | 6/1995 | Werrbach | 330/281 |
| 5,477,191 | 12/1995 | Demicheli | 330/254 |

OTHER PUBLICATIONS

Lewkowicz, J. and O'Day, R. L. Automatic Gain Control with Equalizer:, IBM Tech. Disc. Bull. vol. 21, No. 9, Feb.1979 pp. 3569–3570.
French Search Report from French Patent Application No. 96 02783, filed Feb. 29, 1996.
Patent Abstracts of Japan, vol. 95, No. 012 & JP–A–07 321706 (Fujitsu General Ltd.) Dec., 1995.
Patent Abstracts of Japan, vol. 009, No. 210 (P–383), Aug. 28, 1985 & JP–A–60 072003 (Hitachi).

* cited by examiner

*Primary Examiner*—Steven J. Mottola
(74) *Attorney, Agent, or Firm*—Wolf, Greenfield & Sacks, P.C.; James H. Morris; Theodore E. Galanthay

(57) ABSTRACT

An automatic gain control circuit comprising a variable gain amplifier having first and second differential gain control terminals, the first gain control terminal being connected to a constant reference voltage, a peak detector connected to the output of the variable gain amplifier and an integrator connected between the output of the peak detector and the second differential gain control terminal. The circuit further includes an integrating capacitor coupled to a ground terminal and a second capacitor connected between the first and second differential gain control terminals.

32 Claims, 1 Drawing Sheet

AUTOMATIC GAIN CONTROL CIRCUIT USING A CAPACITOR FOR MINIMIZING DIGITAL COUPLING

BACKGROUND OF THE INVENTION

1. Field of the Invention

The present invention relates to an automatic gain control circuit which is likely to be integrated on the same chip as mixed (analog and digital) signal processing circuits.

2. Discussion of the Related Art

FIG. 1 shows a conventional automatic gain control circuit. It includes a variable gain amplifier 10 having a gain control input G. The gain of amplifier 10 is set by the voltage applied to the control input G. Often, especially in noisy environments, the input signal Vin to amplifier 10 and the gain control input G are differential.

An automatic gain control loop includes a peak detector 12 receiving the output Vout of amplifier 10, and an integrator 13 which receives the output of peak detector 12 and controls the gain of amplifier 10.

The integrator could have a differential output for driving the differential control input G of amplifier 10. However, such a differential integrator would need at least one high value integrating capacitor having both its terminals connected to variable signals. This high value capacitor is usually not integrable, whereby an integrated circuit including the automatic gain control circuit would need two additional pins for connecting the high value capacitor externally.

With the type of integrator shown in FIG. 1, the integrated circuit only needs one pin 14 for connecting the external integrating capacitor C. The integrator shown includes a transconductance amplifier 16 receiving the output of peak detector 12 on a non-inverting input (+) and receiving a reference voltage Vref1 on an inverting input (−). The output of the transconductance amplifier 16 is connected to a first terminal of capacitor C through pin 14 and to an inverting terminal g− of the differential gain control input of amplifier 10. The non-inverting terminal g+ of the gain control input receives a constant reference voltage Vref2. The other terminal of capacitor C is connected to an analog ground AGND.

Usually, the automatic gain control circuit of FIG. 1 is integrated on the same chip as digital circuits 18 which, for example, carry out a digital processing of the output Vout of amplifier 10. These digital circuits have a digital ground DGND which is in principle not connected to the analog ground AGND. However, digital noise caused by the high frequencies used in the digital circuits 18, inevitably couples into the analog ground AGND. This digital noise affects the gain control input G of amplifier 10 through capacitor C and causes distortion of the output signal Vout.

Capacitor C happens to be the only path through which the digital noise can affect the circuit. Any other path coupled to ground has noise canceling abilities. For example, the digital noise in the power supply lines (not shown) is canceled by the power-supply rejection ratio (PSRR) of amplifiers 10 and 16. The reference voltages Vref1 and Vref2 are provided by low-noise voltage sources (not shown), which can be considered as not coupled to ground.

One solution to avoid digital noise affecting the circuit would be to use an integrator 13 with a differential output for driving the gain control input G of amplifier 10 in differential mode. However, as previously explained, the external capacitor C would have to be connected by two integrated circuit pins instead of only one.

Another solution would be to connect capacitor C to a low impedance low-noise voltage source, instead of to ground AGND. Here, two pins would again be necessary for connecting external capacitor C.

SUMMARY OF THE INVENTION

An object of the invention is to provide an automatic gain control circuit which is affected little by digital noise coupled through ground, while having only one pin for connecting an external integrating capacitor.

To achieve this object, the present invention provides an automatic gain control circuit comprising a variable gain amplifier having two differential gain control terminals, a first of said gain control terminals being connected to a constant reference voltage, a peak detector connected to the output of the variable gain amplifier and an integrator connected between the output of the peak detector and the second differential gain control terminal. The circuit further includes an integrating capacitor coupled to a ground terminal; and a second capacitor connected between the two differential gain control terminals.

According to an embodiment of the present invention, the second capacitor is integrated with the automatic gain control circuit on a same chip.

According to an embodiment of the present invention, the integrator includes a transconductance amplifier whose output is connected to said integrating capacitor and to the second differential gain control terminal.

According to another embodiment of the present invention, an automatic gain control circuit is disclosed, comprising a variable gain amplifier having first and second differential gain control terminals, the first differential gain control terminal being coupled to a constant reference voltage, a peak detector coupled to an output of the variable gain amplifier and an integrator coupled between an output of the peak detector and a ground terminal, and having an output coupled to the second differential gain control terminal. The invention further comprises means for minimizing noise from the ground terminal coupled between the first and second differential gain control terminals. The minimizing means comprises a first capacitor having a first terminal connected to the first differential gain control terminal and a second terminal connected to the send differential gain control terminal. The integrator includes an amplifier having an output coupled to the output of the integrator and an input coupled to the output of the peak detector, and a second capacitor coupled between the ground terminal and the output of the amplifier. The first capacitor is integrated on a same chip as the automatic gain control circuit.

According to another embodiment of the present invention, a method of minimizing noise in an automatic gain control circuit is disclosed, the method comprising amplifying an input signal in accordance with first and second differential gain control signals and outputting an amplified signal, detecting peaks of the amplified signal and outputting a peak signal, integrating the peak signal to provide the first differential gain control signal and minimizing noise in the first differential gain control signal by capacitively coupling the first differential gain control signal to the second differential gain control signal. The minimizing step comprises equalizing noise in the second differential gain control signal with the noise in the first differential gain control signal.

In another embodiment of the present invention, an automatic gain control circuit is disclosed, comprising a variable gain amplifier having an input, an output and first and second differential gain control terminals, an integrator coupled between the output of the variable gain amplifier and the first differential gain control terminal and means for coupling high frequency noise on the first differential gain control terminal to the second differential gain control terminal. The coupling means comprises a first capacitor having a first terminal coupled to the first differential gain control terminal and a second terminal coupled to the second differential gain control terminal.

The foregoing and other objects, features, aspects and advantages of the invention will become apparent from the following detailed description of embodiments, given by way of illustration and not of limitation with reference to the accompanying drawings.

DETAILED DESCRIPTION

Figure 1:
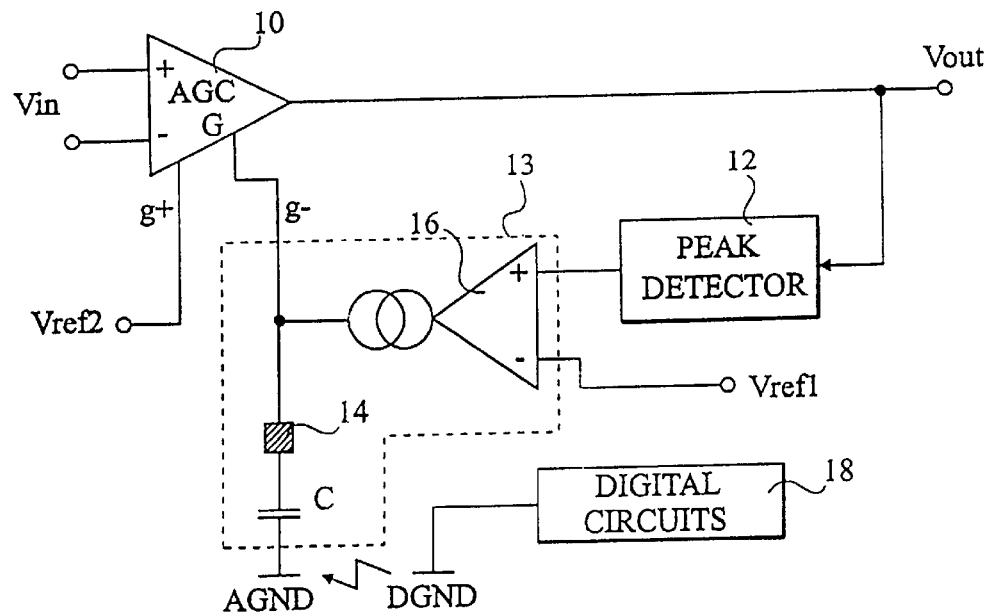
FIG. 1, previously described, shows a conventional automatic gain control circuit which is often integrated on the same chip as digital circuits.
Figure 2:
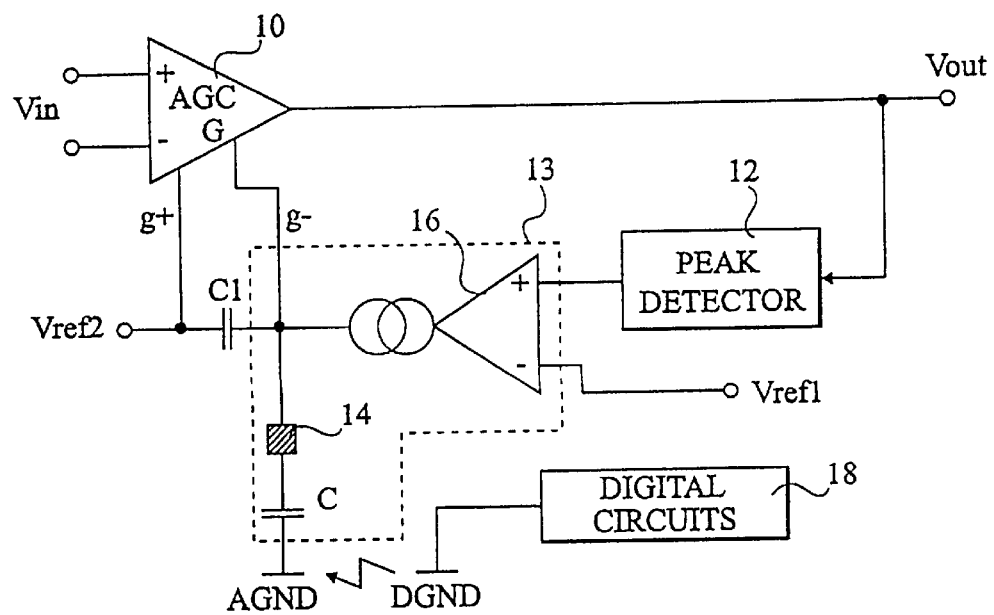
FIG. 2 shows the automatic gain control circuit of FIG. 1, incorporating an embodiment of the invention for minimizing the effects of digital noise.

FIG. 2 is identical to FIG. 1, except for a capacitor C1 connected, according to the invention, between the two terminals g+ and g− of the differential gain control input G of amplifier 10. The role of capacitor C1 is to couple any high frequency noise present at pin 14 to terminal g+ of the gain control input G.

With this configuration, the noise at pin 14 is converted by capacitor C1 to a common-mode voltage with respect to the differential control input G, and is thus canceled by the common-mode rejection ratio of amplifier 10.

Best results are obtained when the noise at terminal g+ equals the noise at terminal g−. This is approached by increasing the value of capacitor C1 and/or by increasing the impedance of the voltage source providing voltage Vref2. However, capacitor C1 must stay integrable on a reasonable semiconductor surface area.

As an example, good results are obtained with an approximate value of 80 pF for capacitor C1, the impedance of the source providing voltage Vref2 being approximately 10 kΩ. If the impedance of this voltage source is not high enough, reference voltage Vref2 may be applied to control terminal g+ through a resistor of suitable value.

Many alternatives and modifications of the invention will appear to those skilled in the art. Capacitor C is not necessarily directly connected to ground. It may be coupled to ground by being connected to a power-supply line.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An automatic gain control circuit comprising:
    a variable gain amplifier having first and second differential gain control terminals, said first gain control terminal being connected to a constant reference voltage;
    a peak detector connected to an output of the variable gain amplifier; and
    an integrator connected between an output of the peak detector and the second differential gain control terminal, and including a first capacitor coupled to a ground terminal;
    the circuit characterized in that it comprises a second capacitor connected between the first and second differential gain control terminals.

2. The automatic gain control circuit according to claim 1, wherein the second capacitor is integrated with the automatic gain control circuit on a same chip.

3. The automatic gain control circuit according to claim 1, wherein the integrator includes a transconductance amplifier having an output connected to said first capacitor and to the second differential gain control terminal.

4. An automatic gain control circuit comprising:
    a variable gain amplifier having first and second differential gain control terminals, said first differential gain control terminal being coupled to a constant reference voltage;
    a peak detector coupled to an output of the variable gain amplifier;
    an integrator coupled between an output of said peak detector and a ground terminal, and having an output coupled to said second differential gain control terminal; and
    means for minimizing noise from said ground terminal coupled between said first and second differential gain control terminals.

5. The automatic gain control circuit of claim 4, wherein said minimizing means comprises a first capacitor having a first terminal connected to said first differential gain control terminal and a second terminal connected to said second differential gain control terminal.

6. The automatic gain control circuit of claim 5, wherein said integrator includes an amplifier having an output coupled to said output of said integrator and an input coupled to said output of said peak detector, and a second capacitor coupled between said ground terminal and said output of said amplifier.

7. The automatic gain control circuit of claim 6, wherein said first capacitor is integrated on a same chip as the automatic gain control circuit.

8. A method of minimizing noise in an automatic gain control circuit, the method comprising:
    amplifying an input signal in accordance with first and second differential gain control signals and outputting an amplified signal;
    detecting peaks of said amplified signal and outputting a peak signal;
    integrating said peak signal to provide said first differential gain control signal; and
    minimizing noise in said first differential gain control signal by capacitively coupling said first differential gain control signal to said second differential gain control signal.

9. The method of claim 8, wherein said minimizing step comprises equalizing noise in said second differential gain control signal with said noise in said first differential gain control signal.

10. An automatic gain control circuit comprising:
    a variable gain amplifier having an input, an output and first and second differential gain control terminals;
    an integrator coupled between the output of said variable gain amplifier and said first differential gain control terminal; and means for coupling high frequency noise on said first differential gain control terminal to said second differential gain control terminal;

wherein said coupling means comprises a first capacitor having a first terminal coupled to said first differential gain control terminal and a second terminal coupled to said second differential gain control terminal.

11. The automatic gain control circuit of claim 10, further comprising a peak detector coupled between said output of said variable gain amplifier and said integrator.

12. The automatic gain control circuit of claim 10, wherein said integrator comprises a transconductance amplifier having an input coupled to said output of said variable gain amplifier and an output coupled to said first differential gain control terminal, and a second capacitor coupled between a ground terminal and said first differential gain control terminal.

13. The automatic gain control circuit of claim 12, wherein said first capacitor is integrated on a same chip as the automatic gain control circuit.

14. An automatic gain control circuit comprising:

a variable gain amplifier having first and second differential gain controls;

a peak detector connected to an output of the variable gain amplifier;

an integrator connected between an output of the peak detector and the second differential gain control, and including a noise filter; and a noise coupler that couples noise from the second differential gain control to the first differential gain control;

wherein the noise coupler comprises a first capacitor.

15. The automatic gain control circuit according to claim 14, wherein the noise filter comprises a second capacitor coupling the second differential gain control and ground.

16. The automatic gain control circuit according to claim 14, wherein the first differential gain control is connected to a constant reference voltage.

17. The automatic gain control circuit according to claim 14, wherein the integrator comprises a transconductance amplifier.

18. An automatic gain control circuit comprising:

a variable gain amplifier having first and second differential gain controls;

a peak detector connected to an output of the variable gain amplifier;

an integrator connected between an output of the peak detector and the second differential gain control, and including a noise filter; and means for coupling noise from the second differential gain control to the first differential gain control;

wherein said means for coupling noise comprises a first capacitor.

19. The automatic gain control circuit according to claim 18, wherein the noise filter comprises a second capacitor coupling the second differential gain control and ground.

20. The automatic gain control circuit according to claim 18, wherein the first differential gain control is connected to a constant reference voltage.

21. The automatic gain control circuit according to claim 18, wherein the integrator comprises a transconductance amplifier.

22. A method for amplifying a signal and automatically controlling a gain of the signal comprising the steps of:

variably amplifying the signal with a gain controlled by first and second differential gain controls;

detecting peaks in the variably amplified signal;

integrating the detected peaks;

filtering the integrated detected peaks;

feeding back the filtered integrated detected peaks to the second differential gain control terminal; and introducing noise from the second differential gain control to the first differential gain control;

wherein the step of introducing noise from the second differential gain control to the first differential gain control comprises capacitatively coupling the second differential gain control and the first differential gain control.

23. The method according to claim 22, wherein the step of filtering the integrated detected peaks comprises capacitatively coupling the second differential gain control and ground.

24. The method according to claim 22, wherein the first differential gain control is connected to a constant reference voltage.

25. The method according to claim 22, wherein the step of integrating the detected peaks includes amplifying using a transconductance amplifier.

26. The automatic gain control circuit according to claim 2, wherein the automatic gain control circuit is integrated on the same chip with a digital circuit.

27. The automatic gain control circuit according to claim 7, wherein the automatic gain control circuit is integrated on the same chip with a digital circuit.

28. The automatic gain control circuit according to claim 13, wherein the automatic gain control circuit is integrated on the same chip with a digital circuit.

29. The automatic gain control circuit of claim 14, wherein said first capacitor is integrated on a same chip as the automatic gain control circuit.

30. The automatic gain control circuit according to claim 29, wherein the automatic gain control circuit is integrated on the same chip with a digital circuit.

31. The automatic gain control circuit of claim 18, wherein said first capacitor is integrated on a same chip as the automatic gain control circuit.

32. The automatic gain control circuit according to claim 31, wherein the automatic gain control circuit is integrated on the same chip with a digital circuit.

* * * * *